(12) United States Patent
Nakajima et al.

(10) Patent No.: US 6,914,284 B2
(45) Date of Patent: Jul. 5, 2005

(54) MAGNETIC MEMORY DEVICE AND METHOD OF MANUFACTURING THE SAME

(75) Inventors: Kentaro Nakajima, Tokyo (JP); Keiji Hosotani, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/722,514

(22) Filed: Nov. 28, 2003

(65) Prior Publication Data

US 2004/0173828 A1 Sep. 9, 2004

(30) Foreign Application Priority Data

Nov. 28, 2002 (JP) ......................................... 2002-346036
Nov. 11, 2003 (JP) ......................................... 2003-381506

(51) Int. Cl.[7] ............................................. H01L 31/062
(52) U.S. Cl. ................ 257/295; 257/421; 257/E27.006; 438/3
(58) Field of Search ................................. 257/295, 421, 257/E27.006; 438/3

(56) References Cited

U.S. PATENT DOCUMENTS 6,746,875 B2 * 6/2004 Okazawa et al. ............... 438/3

OTHER PUBLICATIONS

U.S. Appl. No. 10/615,920, filed Jul. 10, 2003, Hosotani et al.
U.S. Appl. No. 10/722,514, filed Nov. 28, 2003, Nakajima et al.

Roy Scheuerlein et al., "A 10ns Read and Write Non–Volatile Memory Array Using a Magnetic Tunnel Junction and FET Switch in each Cell", ISSCC Digest of Technical Papers, 2000, Session 7, Paper TA 7.2.

Masashige Sato et al., "Spin–Valve–Like Properties and Annealing Effect in Ferromagnetic Tunnel Junctions", IEEE Transactions on Magnetics, 1997, vol. 33, No. 5, pp. 3553–3555.

Masashige Sato et al., "Spin–Valve–Like Properties of Ferromagnetic Tunnel Junctions", Jpn. J. Appl. Phys., 1997, vol. 36, Part 2, pp. 200–201.

Koichiro Inomata et al., "Spin–Dependent Tunneling between a Soft Ferromagnetic Layer and Hard Magnetic Nanosize Particles", Jpn. J. Appl. Phys., 1997, vol. 36, Part 2, pp. 1380–1383.

* cited by examiner

Primary Examiner—David Nelms
Assistant Examiner—Tu-Tu Ho
(74) Attorney, Agent, or Firm—Oblon, Spivak, McClelland, Maier & Neustadt, P.C.

(57) ABSTRACT

A magnetic memory device includes a first interconnection which runs in a first direction, a second interconnection which runs in a second direction different from the first direction, a magnetoresistive element which is arranged at the intersection of and between the first and second interconnections, and a metal layer which is connected to the magnetoresistive element and has a side surface that partially coincides with a side surface of the magnetoresistive element.

23 Claims, 14 Drawing Sheets

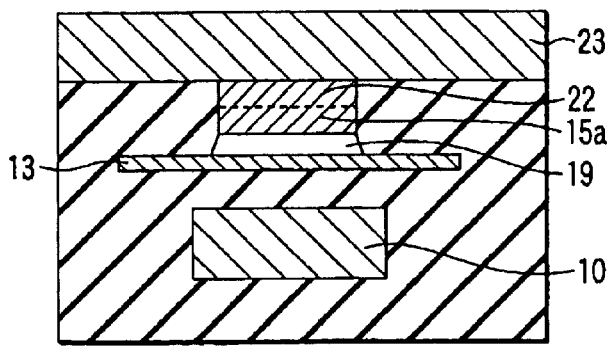
FIG. 28
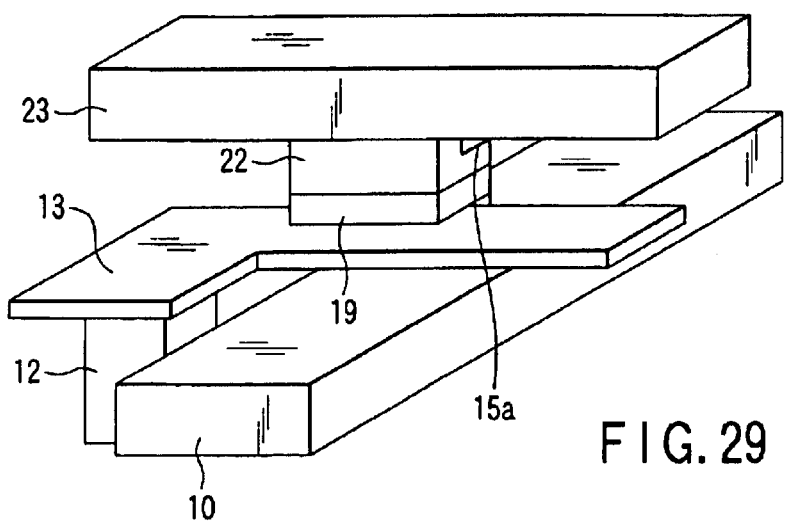
FIG. 29
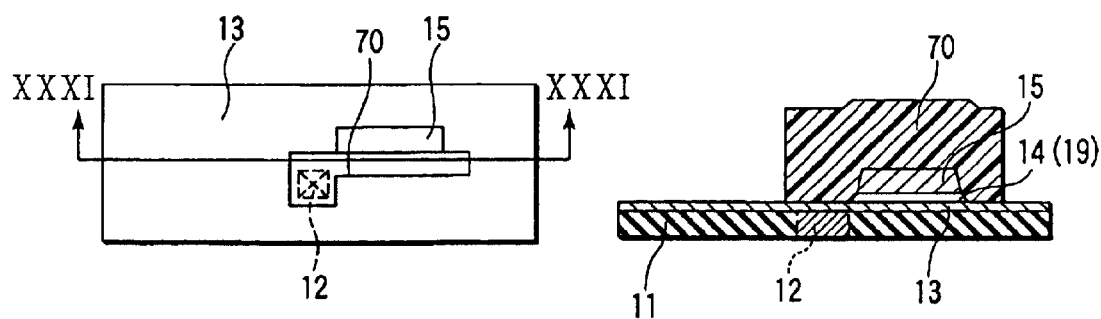
FIG. 30
FIG. 31

MAGNETIC MEMORY DEVICE AND METHOD OF MANUFACTURING THE SAME

CROSS-REFERENCE TO RELATED APPLICATIONS

This application is based upon and claims the benefit of priority from the prior Japanese Patent Applications No. 2002-346036, filed Nov. 28, 2002; and No. 2003-381506, filed Nov. 11, 2003, the entire contents of both of which are incorporated herein by reference.

BACKGROUND OF THE INVENTION

1. Field of the Invention

The present invention relates to an information reproduction technique using a ferromagnetic body and, more particularly, to a magnetic memory device using a magnetoresistive element and a method of manufacturing the same.

2. Description of the Related Art

A magnetic random access memory (to be abbreviated as an MRAM hereinafter) is a general term for solid-state memories which can rewrite, hold, and read out recording information at any time by using the magnetization direction of a ferromagnetic body as an information recording medium.

A memory cell of an MRAM normally has a structure formed by stacking a plurality of ferromagnetic layers. To record information, the relationship between the magnetization directions of the plurality of ferromagnetic bodies that form the memory cell is set to "parallel" or "anti-parallel". Binary information "0" or "1" is recorded in correspondence with the parallel or anti-parallel state.

A write of recording information is executed by supplying a current to write lines which are laid out in a cross stripe and inverting the magnetization direction of the ferromagnetic body of each cell by a current magnetic field generated by the current. Since the MRAM is a nonvolatile memory, power consumption is zero during holding of recorded information in principle, and recorded information is held even after power-off.

On the other hand, a read of recorded information is executed by using a so-called magnetoresistive effect. In this phenomenon, the electrical resistance of a memory cell changes depending on the relative angle between a sense current and the magnetization direction of the ferromagnetic body of the cell or the relative angle in magnetization between the plurality of ferromagnetic layers.

The MRAM has a number of functional advantages as compared to a conventional semiconductor memory using a dielectric material. More specifically, (1) the MRAM is completely nonvolatile and can be rewritten $10^{15}$ times or more. (2) Since a nondestructive read can be executed, and no refresh operation is necessary, the read cycle can be shortened. (3) The resistance against radiation is high as compared to a charge accumulation type memory cell. The degree of integration per unit area and the write and read times of the MRAM would be almost the same as those of a DRAM. MRAMs which have nonvolatility as a remarkable characteristic are therefore expected to be applied to external recording devices for portable equipment, LSI embedded memories, and main memories of personal computers.

MRAMs which are presently considered for practical application use an element that exhibits a tunnel magnetoresistance effect (to be abbreviated as a TMR effect hereinafter) as a memory cell (e.g., Roy Scheuerlein, et al., "A 10ns Read and Write Non-Volatile Memory Array Using a Magnetic Tunnel Junction and FET Switch in each Cell", 2000ISSCC Digest of Technical Papers, U.S.A., February 2000, pp. 128–129). The element (to be referred to as an MTJ (Magnetic Tunnel Junction) element hereinafter) that exhibits the TMR effect is mainly constructed by a three-layered structure of ferromagnetic layer/ insulating layer/ ferromagnetic layer. A current tunnels through the insulating layer. The tunnel resistance value changes in proportion to the cosine of the relative angle of the magnetization directions of the two ferromagnetic metal layers, and takes a maximal value when the magnetization directions are anti-parallel. For example, in a tunnel junction made of NiFe/ Co/Al$_2$O$_3$/Co/NiFe, a magnetoresistance change rate more than 25% is observed in a low magnetic field of 50 Oe or less (e.g., M Sato, et al., "Spin-Value-Like Properties and Annealing Effect in Ferromagnetic Tunnel Junctions", IEEE Trans. Mag., U.S.A., 1997, Vol. 33, No. 5, pp. 3553–3555).

As a structure of an MTJ element, a so-called spin valve structure is known in which an anti ferromagnetic body is arranged adjacent to one ferromagnetic body to fix the magnetization direction to increase the magnetic field sensitivity (e.g., M Sato, et al., "Spin-Value-Like Properties and Annealing Effect in Ferromagnetic Tunnel Junctions", Jpn. J. Appl. Phys., 1997, Vol. 36, Part 2, pp. 200–201). Another known structure has two tunnel barriers to improve the bias dependence of the magnetoresistance change rate (e.g., K Inomata, et al., "Spin-dependent tunneling between a soft ferromagnetic layer and hard magnetic nano particles, Jpn. J. Appl. Phys., 1997, Vol. 36, Part 2, pp. 1380–1383).

When the above MTJ element is applied to an MRAM, each memory cell has a planar structure shown in FIG. 57 or 58. As shown in FIG. 57 or 58, MTJ elements 19 are laid out at the intersections of and between word lines 10 and bit lines 23. A switching element (not shown) such as a MOS transistor is connected to the lower surface of each MTJ element 19 through a lower metal layer 13 and contact 12.

In the prior-art MRAM, the lower metal layer 13 is formed such that it exists even outside the side surfaces of the MTJ element 19 and contact 12. That is, a margin is generated in consideration of misalignment to the MTJ element 19 and contact 12. To separate adjacent cells, the lower metal layers 13 are formed at minimum pitches A and B. Under these circumstances, it is difficult to reduce a pitch X' or X" between the word lines 10 or a pitch Y' or Y" between the bit lines 23 by a predetermined amount or more. This problem becomes more conspicuous as the cell size is required to be smaller.

BRIEF SUMMARY OF THE INVENTION

According to a first aspect of the present invention, there is provided a magnetic memory device comprising a first interconnection which runs in a first direction, a second interconnection which runs in a second direction different from the first direction, a magnetoresistive element which is arranged at an intersection of and between the first and second interconnections, and a metal layer which is connected to the magnetoresistive element and has a side surface that partially coincides with a side surface of the magnetoresistive element.

According to a second aspect of the present invention, there is provided a method of manufacturing a magnetic memory device, comprising sequentially forming a metal layer, a magnetoresistive film, and first and second mask layers on a first insulating film, patterning the second mask layer into an element shape of a magnetoresistive element, patterning the first mask layer into the element shape by using the patterned second mask layer, patterning the magnetoresistive film into the element shape by using the patterned first mask layer to form the magnetoresistive element, and patterning the metal layer into a separation shape that separates cells and making a side surface of the metal layer partially coincide with a side surface of the magnetoresistive element.

BRIEF DESCRIPTION OF THE SEVERAL VIEWS OF THE DRAWING

FIG. 28 is a sectional view showing the magnetic memory device taken along a line XXVIII—XXVIII in FIG. 26;

FIG. 29 is a perspective view showing the magnetic memory device according to the second embodiment of the present invention;

FIG. 30 is a plan view showing a step in manufacturing the magnetic memory device according to the second embodiment of the present invention;

FIG. 31 is a sectional view of the magnetic memory device taken along a line XXXI—XXXI in FIG. 30;

DETAILED DESCRIPTION OF THE INVENTION

Figures 1, 2:
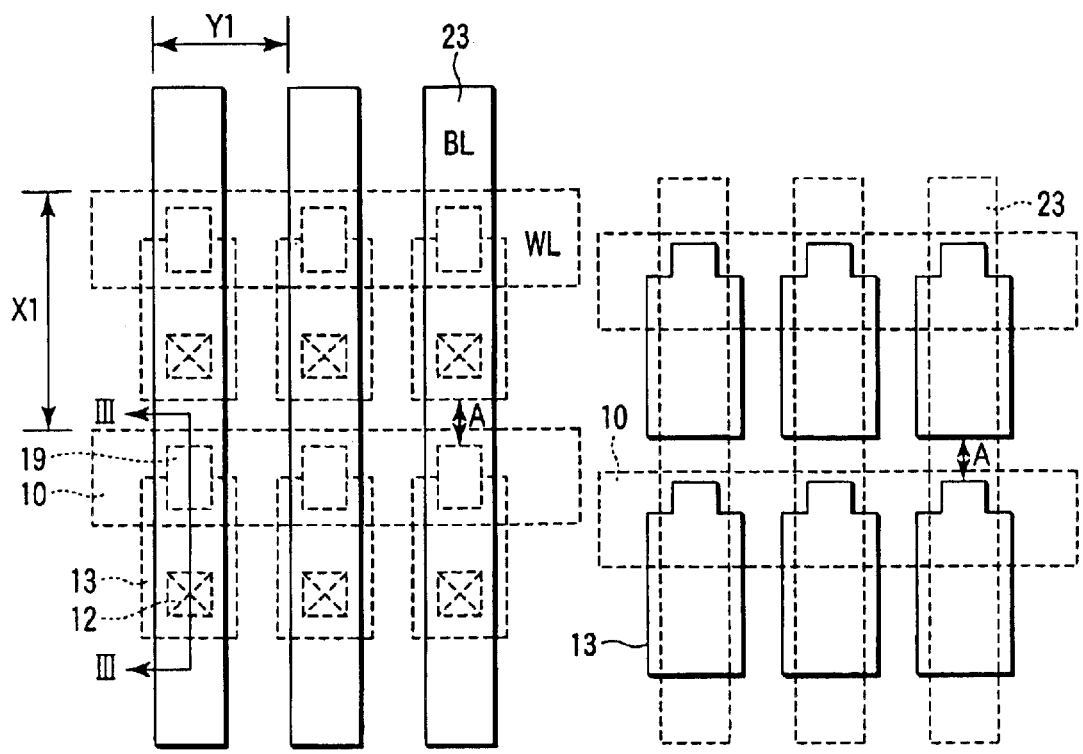
FIG. 1 is a plan view showing a magnetic memory device according to the first embodiment of the present invention.
FIG. 2 is a plan view showing a lower metal layer according to the first embodiment of the present invention.

The embodiments of the present invention will be described below with reference to the accompanying drawing. In the description, the same reference numerals denote the same parts throughout the drawing.

[First Embodiment]

In the first embodiment, a lower metal layer is formed without preparing any margin with respect to a magnetoresistive element. The lower metal layer is formed such that its side surfaces partially coincide with the side surfaces of the magnetoresistive element.

Figure 3:
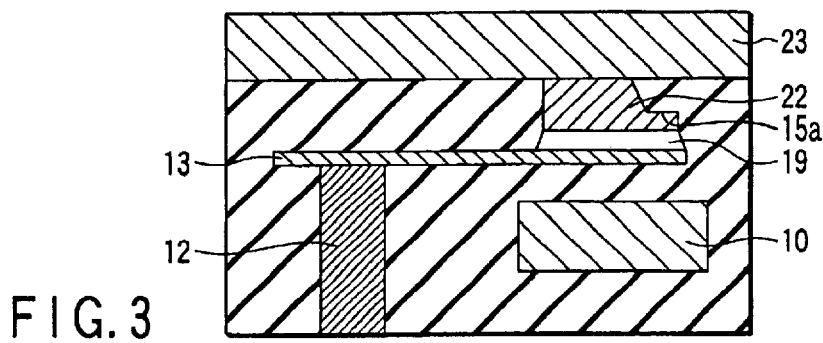
FIG. 3 is a sectional view showing the magnetic memory device taken along a line III—III in FIG. 1.
Figure 4:
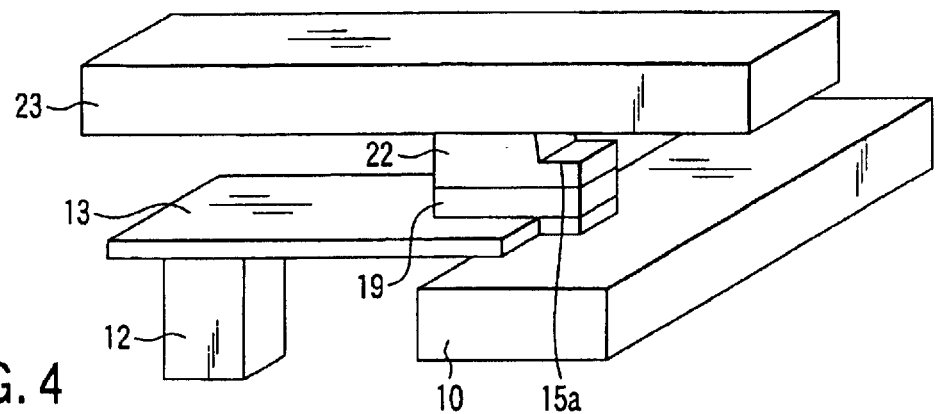
FIG. 4 is a perspective view showing the magnetic memory device according to the first embodiment of the present invention.

FIG. 1 is a plan view of a magnetic memory device according to the first embodiment of the present invention. FIG. 2 is a plan view of a lower metal layer according to the first embodiment of the present invention. Bit lines and word lines are illustrated for reference. FIG. 3 is a sectional view of the magnetic memory device taken along a line III—III in FIG. 1. FIG. 4 is a perspective view of the magnetic memory device according to the first embodiment of the present invention.

As shown in FIGS. 1 to 4, in the magnetic memory device according to the first embodiment, a lower metal layer 13 is formed without preparing any margin around a magnetoresistive element 19. The side surfaces of the lower metal layer 13 partially coincide with the side surfaces of the magnetoresistive element 19. For this reason, the lower metal layer 13 partially has the same shape as that of the magnetoresistive element 19.

The MTJ elements 19 are laid out at the intersections of and between word lines 10 and bit lines 23. The bit line 23 is connected to the upper surface of the magnetoresistive element 19 through a second contact 22. A switching element (not shown) such as a MOS transistor is connected to the lower surface of the magnetoresistive element 19 through the lower metal layer 13 and a first contact 12. The magnetoresistive element 19 is arranged such that its axis of easy magnetization matches the direction in which the bit line 23 runs.

The first contact 12 is covered with the lower metal layer 13 and arranged in the longitudinal direction (axis of easy magnetization) of the magnetoresistive element 19. More specifically, the first contact 12 is arranged between the adjacent word lines 10 and below the bit line 23. The lower metal layer 13 is patterned such that the side surfaces of the magnetoresistive element 19, which are on the opposite side of a side surface located on the first contact 12 side, partially coincide with those of the lower metal layer 13.

The second contact 22 is first used as a mask in patterning the magnetoresistive element 19 and then used as a contact. For this reason, the second contact 22 has the same planar shape as that of the magnetoresistive element 19. Part of the upper surface of the second contact 22, which is not in contact with the bit line 23, forms a step portion 15a.

The magnetoresistive element 19 is an MTJ (Magnetic Tunnel Junction) element which has, e.g., a magnetization fixed layer (magnetic layer) in which the magnetization direction is fixed, a tunnel junction layer (nonmagnetic layer), and a magnetic recording layer (magnetic layer) in which the magnetization direction can be reversed. The MTJ element can have either a single tunnel junction structure having one tunnel junction layer, as described above, or a double tunnel junction layer having two tunnel junction layers. At least one of the magnetization fixed layer and magnetic recording layer may have a three-layered structure having a ferromagnetic layer, a nonmagnetic layer, and a ferromagnetic layer. A GMR (Giant Magnetic Resistive) element which has, e.g., two magnetic layers and a conductive layer sandwiched therebetween may be used in place of the MTJ element.

FIGS. 5 to 24 show steps in manufacturing the magnetic memory device according to the first embodiment of the present invention. The method of manufacturing the magnetic memory device according to the first embodiment will be described below. Steps after the first contacts 12 and word lines (not shown) are formed in a first insulating film 11 will be described.

Figure 5:
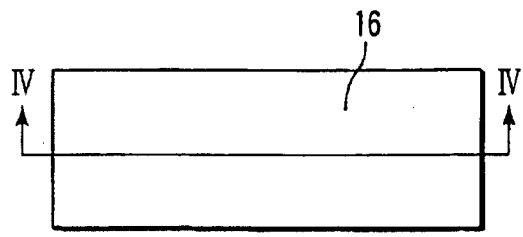
FIG. 5 is a plan view showing a step in manufacturing the magnetic memory device according to the first embodiment of the present invention.
Figure 6:
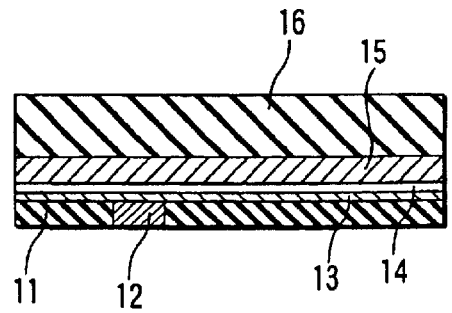
FIG. 6 is a sectional view of the magnetic memory device taken along a line VI—VI in FIG. 5.

First, as shown in FIGS. 5 and 6, the lower metal layer 13 is formed on the first insulating film 11 and first contact 12. A magnetoresistive film 14 is formed on the lower metal layer 13. Two layers, i.e., first and second hard masks 15 and 16 are formed on the magnetoresistive film 14. The first hard mask 15 is formed from, e.g., a conductive film. The second hard mask 16 is formed from, e.g., a non-conductive film (insulating film). The second hard mask 16 may be formed from a conductive film.

Figure 7:
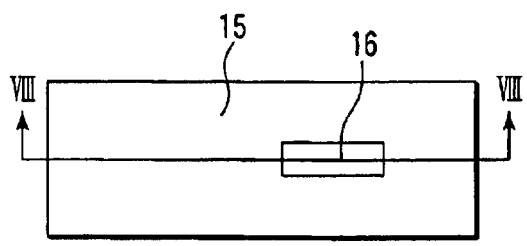
FIG. 7 is a plan view showing a step in manufacturing the magnetic memory device according to the first embodiment of the present invention next to FIG. 5.
Figure 8:
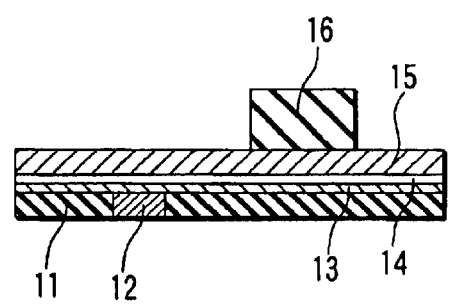
FIG. 8 is a sectional view of the magnetic memory device taken along a line VIII—VIII in FIG. 7.

Next, as shown in FIGS. 7 and 8, the second hard mask 16 is selectively etched to transfer the shape of the magnetoresistive element 19 to the second hard mask 16.

Figure 9:
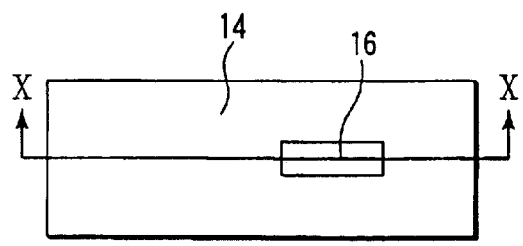
FIG. 9 is a plan view showing a step in manufacturing the magnetic memory device according to the first embodiment of the present invention next to FIG. 7.
Figure 10:
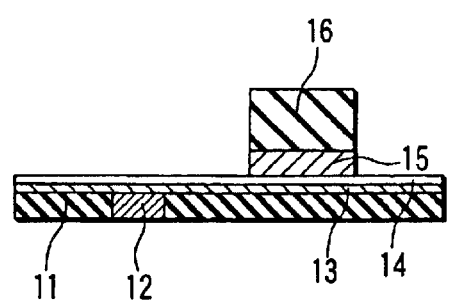
FIG. 10 is a sectional view of the magnetic memory device taken along a line X—X in FIG. 9.

As shown in FIGS. 9 and 10, the first hard mask 15 is etched using the second hard mask 16 to transfer the shape of the magnetoresistive element 19 to the first hard mask 15.

Figure 11:
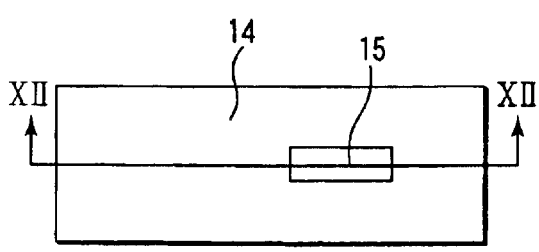
FIG. 11 is a plan view showing a step in manufacturing the magnetic memory device according to the first embodiment of the present invention next to FIG. 9.
Figure 12:
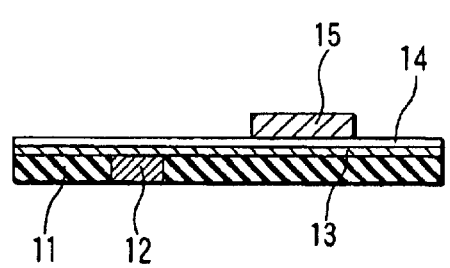
FIG. 12 is a sectional view of the magnetic memory device taken along a line XII—XII in FIG. 11.

As shown in FIGS. 11 and 12, the second hard mask 16 is removed.

Figure 13:
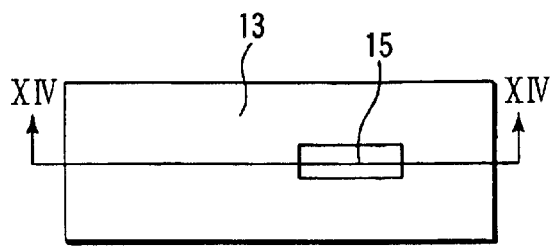
FIG. 13 is a plan view showing a step in manufacturing the magnetic memory device according to the first embodiment of the present invention next to FIG. 11.
Figure 14:
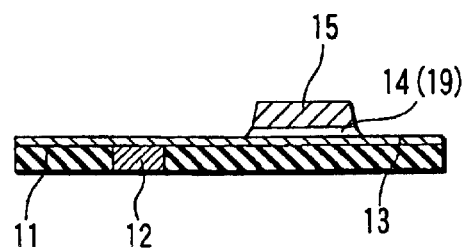
FIG. 14 is a sectional view of the magnetic memory device taken along a line XIV—XIV in FIG. 13.

As shown in FIGS. 13 and 14, the magnetoresistive film 14 is etched using the first hard mask 15. The magnetoresistive film 14 is patterned into the shape of the magnetoresistive element 19.

Figure 15:
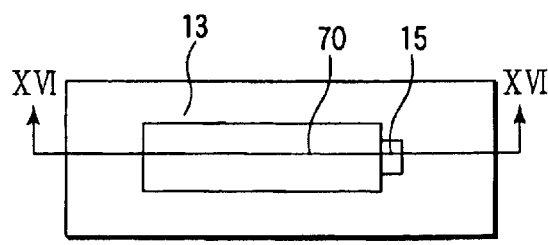
FIG. 15 is a plan view showing a step in manufacturing the magnetic memory device according to the first embodiment of the present invention next to FIG. 13.
Figure 16:
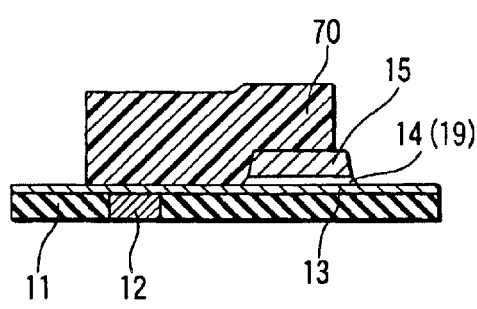
FIG. 16 is a sectional view of the magnetic memory device taken along a line XVI—XVI in FIG. 15.

As shown in FIGS. 15 and 16, a photoresist 70 is applied onto the lower metal layer 13 and first hard mask 15 and patterned into a desired shape. The photoresist 70 having the desired shape covers the first contact 12 and part of the first hard mask 15. That is, the first hard mask 15 is partially exposed without being covered with the photoresist 70.

Figure 17:
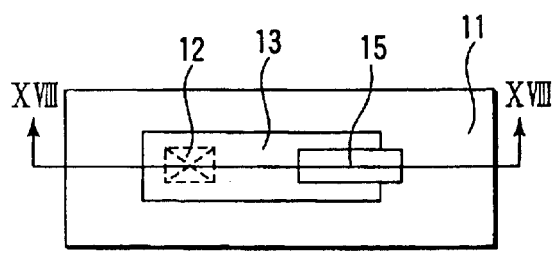
FIG. 17 is a plan view showing a step in manufacturing the magnetic memory device according to the first embodiment of the present invention next to FIG. 15.
Figure 18:
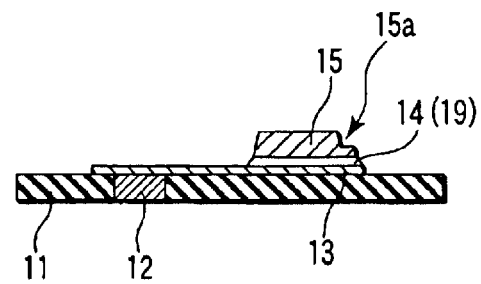
FIG. 18 is a sectional view of the magnetic memory device taken along a line XVIII—XVIII in FIG. 17.

As shown in FIGS. 17 and 18, the lower metal layer 13 is etched using the photoresist 70. At this time, the exposed portion of the first hard mask 15 is also partially removed so that the step portion 15a is formed. Then, the photoresist 70 is removed.

The photoresist 70 does not completely cover the magnetoresistive film 14. However, since the first hard mask 15 is present on the magnetoresistive film 14, etching does not reach the magnetoresistive film 14. To guarantee this effect, the materials, film thicknesses, or etching conditions of the lower metal layer 13 and first hard mask 15 are optimized not to completely etch the first hard mask 15 at the time of etching of the lower metal layer 13. More specifically, a refractory transition metal such as Mo, W, or Ta is suitable for the first hard mask 15. A precious metal such as Pt, Ir, or Ru or a conductive metal nitride such as TiN or TaN, which has a higher etching rate than Mo, W, and Ta, is suitable for the lower metal layer 13. In addition, the first hard mask 15 is formed thicker than the lower metal layer 13.

Figure 19:
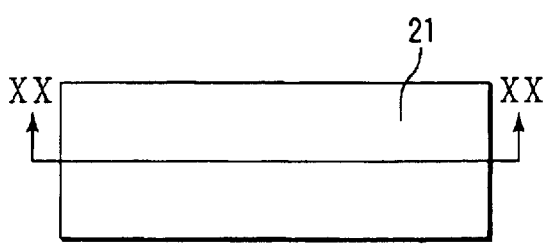
FIG. 19 is a plan view showing a step in manufacturing the magnetic memory device according to the first embodiment of the present invention next to FIG. 17.
Figure 20:
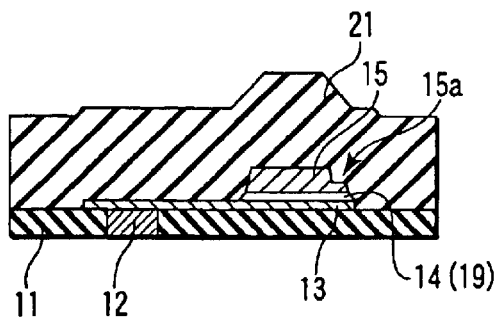
FIG. 20 is a sectional view of the magnetic memory device taken along a line XX—XX in FIG. 19.

As shown in FIGS. 19 and 20, a second insulating film 21 is formed on the first insulating film 11, lower metal layer 13, and first hard mask 15.

Figure 21:
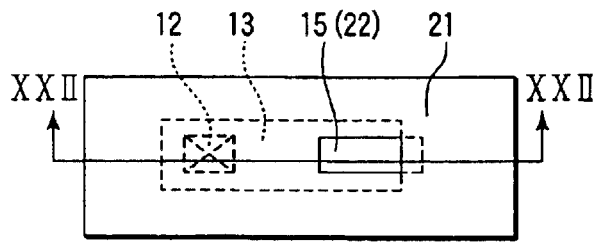
FIG. 21 is a plan view showing a step in manufacturing the magnetic memory device according to the first embodiment of the present invention next to FIG. 19.
Figure 22:
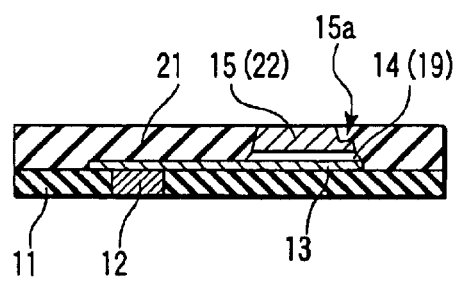
FIG. 22 is a sectional view of the magnetic memory device taken along a line XXII—XXII in FIG. 21.

As shown in FIGS. 21 and 22, the surface of the second insulating film 21 is planarized by using chemical mechanical polishing (to be abbreviated as CMP hereinafter) or reactive ion etching (to be abbreviated as RIE hereinafter) until reaching the first hard mask 15. With this process, the surface of the second contact 22 formed from the first hard mask 15 is exposed so that a contact is formed in a self-aligned manner.

The first hard mask 15 has the step portion 15a on its upper surface. However, it poses no particular problem because the first hard mask 15 is partially exposed from the second insulating film 21 and sufficiently functions as the contact 22.

Figure 23:
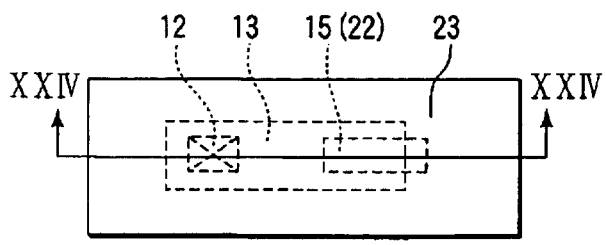
FIG. 23 is a plan view showing a step in manufacturing the magnetic memory device according to the first embodiment of the present invention next to FIG. 21.
Figure 24:
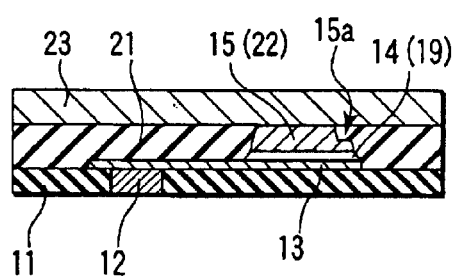
FIG. 24 is a sectional view of the magnetic memory device taken along a line XXIV—XXIV in FIG. 23.

As shown in FIGS. 23 and 24, the bit line 23 is formed on the second contact 22 and second insulating film 21.

According to the first embodiment, the lower metal layer 13 is formed without preparing any margin around the magnetoresistive element 19. The side surfaces of the lower metal layer 13 partially coincide with those of the magnetoresistive element 19. For this reason, if a minimum pitch A is maintained between the adjacent lower metal layers 13 in the direction in which the bit line 23 runs, a pitch X1 between the adjacent word lines 10 can be made smaller than the conventional pitch X'(FIG. 1). As described above, according to the first embodiment, since the area of the lower metal layer 13 can be reduced in the direction in which the bit line 23 runs, the cell area can be reduced.

Figure 57:
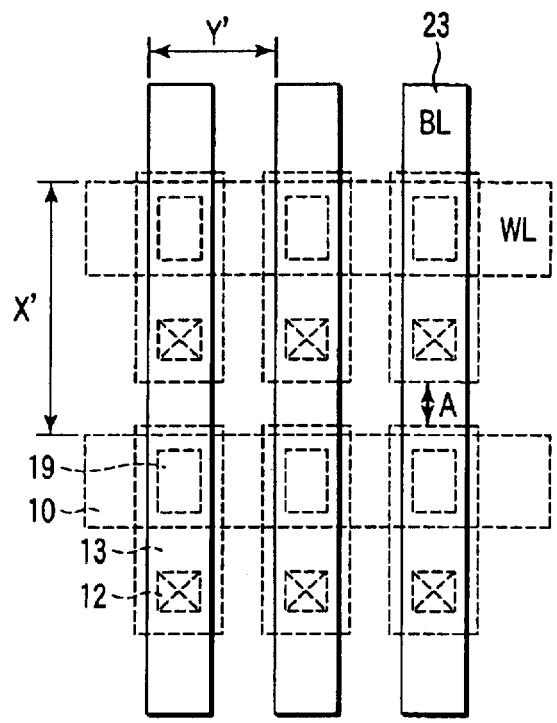
FIG. 57 is a plan view showing a magnetic memory device according to the first prior art.
Figure 58:
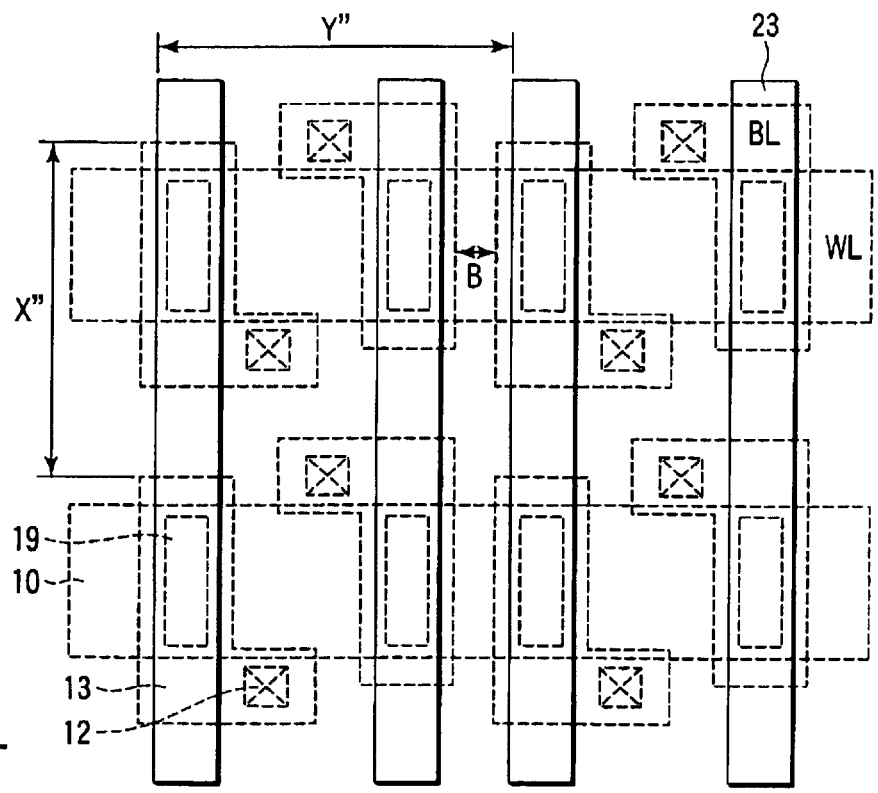
FIG. 58 is a plan view showing a magnetic memory device according to the second prior art.

The pitch A in the prior art shown in FIG. 57 is a minimum feature size determined by the lithography, etching, and burying techniques. It is difficult to make the pitch smaller than the minimum feature size. However, the pitch A in the first embodiment shown in FIG. 1 is determined by self-alignment formation of the lower metal layer 13 and magnetoresistive element 19 and can therefore be made smaller than the minimum feature size. Hence, in the first embodiment, the cell size can greatly be reduced as compared to the prior, and the cell density can be increased.

In the conventional process, the lower metal layer has already been patterned before the first hard mask is patterned into the shape of the magnetoresistive element. The surface of the first insulating film under the lower metal layer is partially exposed. For this reason, when the first hard mask or magnetoresistive film is patterned, the first insulating film is over-etched. In the first embodiment, however, the process of the magnetoresistive element 19 is executed before the process of the lower metal layer 13. Hence, over etching of the first insulating film 11 can be reduced as compared to the prior art.

Since the first hard mask 15 is formed from a conductive film and thus caused to function as the contact 22, the following effect can also be obtained. For example, in the prior art, when a metal film is physically etched, a fence is often formed on a mask member side surface. Such a fence must be removed by brush scrub, mist injection, or ultrasonic cleaning. In the first embodiment, however, a conductive film is used as a mask member (first hard mask 15), which is left unremoved. That is, since the mask member has the contact plug function, the step of removing a fence can be omitted. Hence, the process can be simplified.

Since the projecting region of the lower metal layer 13 around the magnetoresistive element 19 is reduced, a magnetic characteristic shift due to magnetic field leakage caused by the fixed layer or recording layer of the magnetoresistive element 19 can be reduced. Hence, the magnetoresistive element 19 having more stable characteristics can be formed. Particularly, when the projecting region of the lower metal layer 13 is reduced at an end portion along the axis of easy magnetization of the magnetoresistive element 19, the above effect can be increased.

Figure 25:
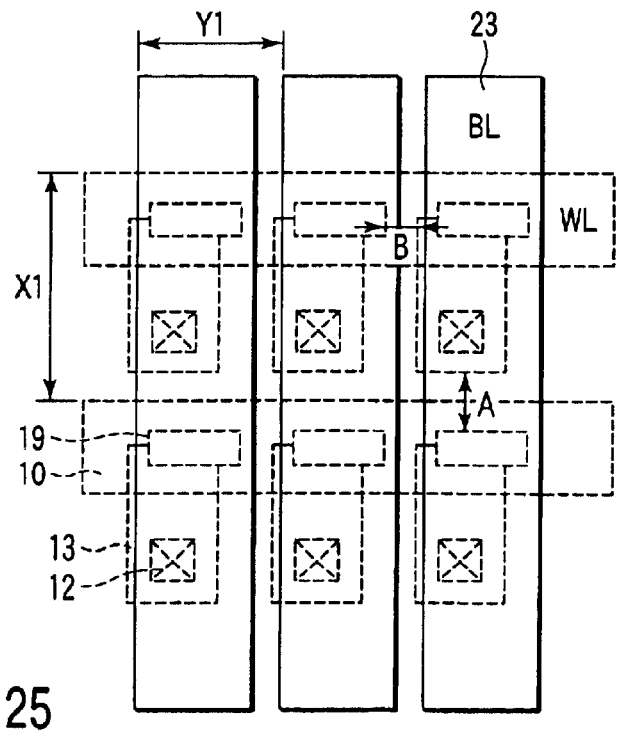
FIG. 25 is a plan view showing another magnetic memory device according to the first embodiment of the present invention.

In the first embodiment, the magnetoresistive element 19 may be arranged such that its axis of hard magnetization matches the direction in which the bit line 23 runs, as shown in FIG. 25. In this case, not only the pitch A in the direction in which the bit line 23 runs but also a pitch B can be reduced in the direction in which the word line 10 runs.

[Second Embodiment]

In the second embodiment, the shape of the lower metal layer of the first embodiment is deformed. The lower metal layer is formed across the magnetoresistive element along its axis of easy magnetization.

Figure 26:
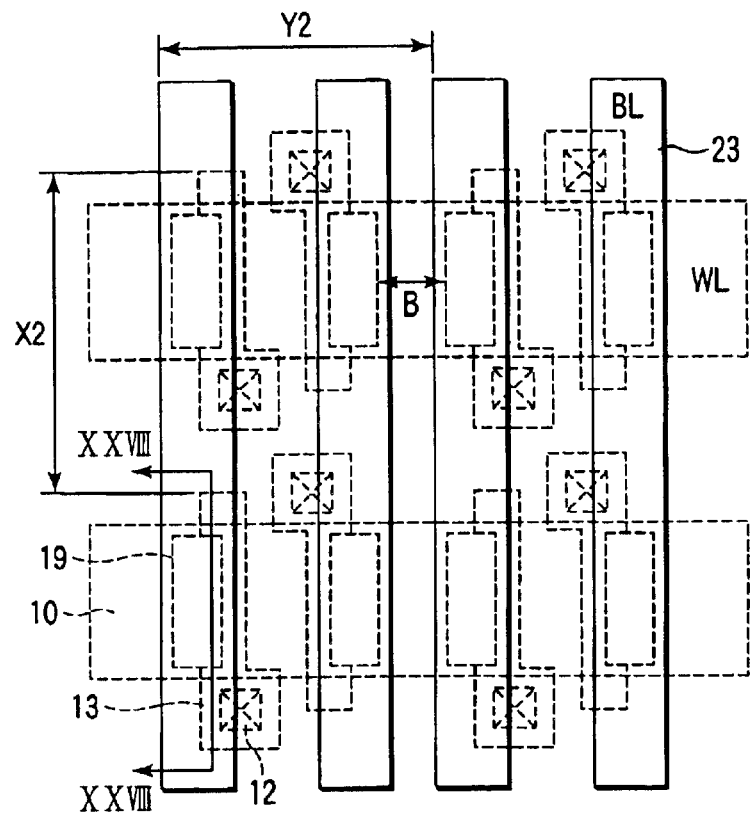
FIG. 26 is a plan view showing a magnetic memory device according to the second embodiment of the present invention.
Figure 27:
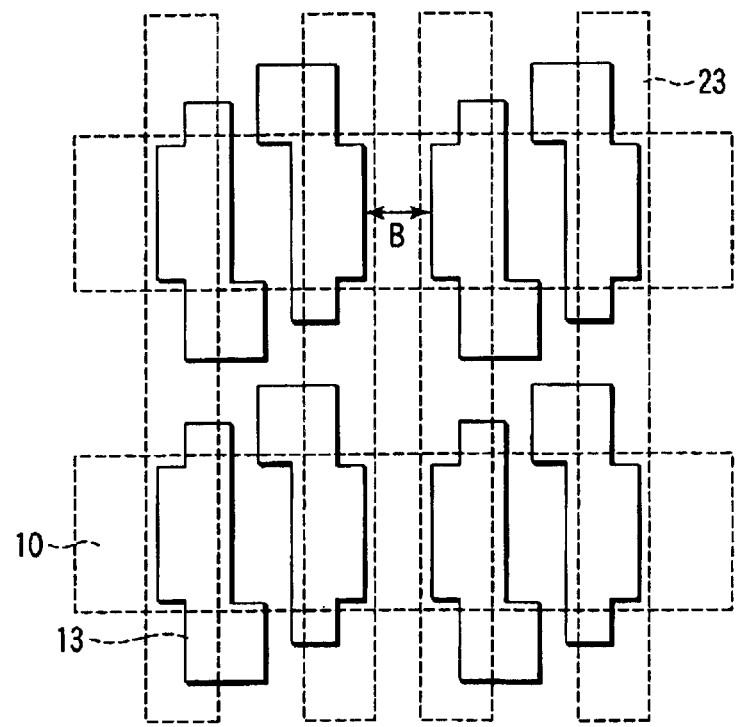
FIG. 27 is a plan view showing a lower metal layer according to the second embodiment of the present invention.

FIG. 26 is a plan view of a magnetic memory device according to the second embodiment of the present invention. FIG. 27 is a plan view of a lower metal layer according to the second embodiment of the present invention. Bit lines and word lines are illustrated for reference. FIG. 28 is a sectional view of the magnetic memory device taken along a line XXVIII—XXVIII in FIG. 26. FIG. 29 is a perspective view of the magnetic memory device according to the second embodiment of the present invention.

As shown in FIGS. 26 to 29, in the magnetic memory device according to the second embodiment, since the shape of a lower metal layer 13 is different from that in the first embodiment, the position where the side surfaces of the lower metal layer 13 coincide with those of a magnetoresistive element 19 also changes. More specifically, in the second embodiment, the lower metal layer 13 is formed across a word line 10. The side surfaces at the center of the lower metal layer 13 coincide with those of the magnetoresistive element 19. For this reason, the side surfaces of the lower metal layer 13 above the word line 10 have the same shape as that of the magnetoresistive element 19. The magnetoresistive element 19 is arranged such that its axis of easy magnetization matches the direction in which a bit line 23 runs.

For the magnetic memory device according to the second embodiment, the lower metal layer 13 is patterned using a resist 70 shown in FIGS. 30 and 31. The remaining processes are the same as in the first embodiment.

According to the second embodiment, the lower metal layer 13 is formed without preparing any margin around the magnetoresistive element 19. The side surfaces of the lower metal layer 13 partially coincide with those of the magnetoresistive element 19. For this reason, if a minimum pitch B is maintained between the adjacent lower metal layers 13 in the direction in which the word line 10 runs, a pitch Y2 between the bit lines 23 can be made smaller than the conventional pitch Y"(FIG. 26). As described above, according to the second embodiment, since the area of the lower metal layer 13 can be reduced in the direction in which the word line 10 runs, the cell area can be reduced.

As in the first embodiment, over-etching can be reduced, and the process can be simplified.

Figure 32:
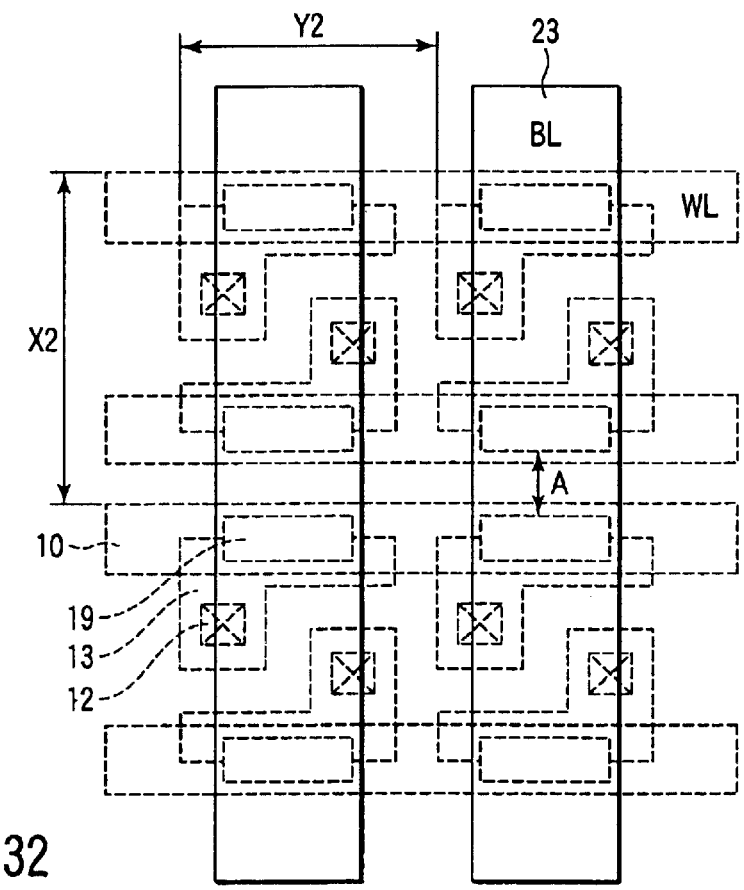
FIGS. 32 to 34 are plan views showing another magnetic memory device according to the second embodiment of the present invention.

In the second embodiment, the magnetoresistive element 19 may be arranged such that its axis of hard magnetization matches the direction in which the bit line 23 runs, as shown in FIG. 32. In this case, a pitch A can be reduced in the direction in which the bit line 23 runs.

Figure 33:
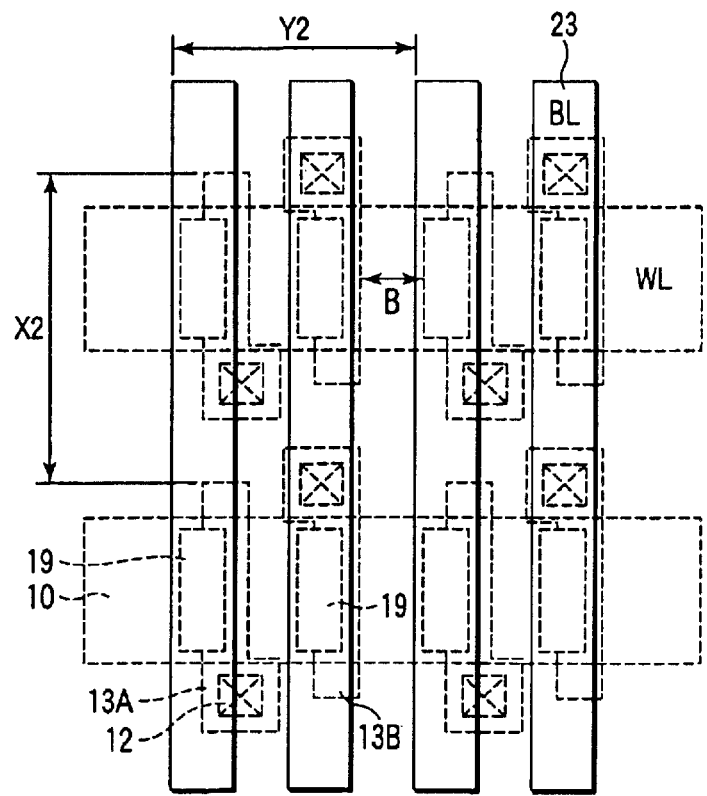

Lower metal layers 13A and 13B adjacent to each other in the direction in which the word line 10 runs are regarded as a pair, as shown in FIG. 33. The side surfaces of one lower metal layer 13A, which are on the opposite side of the other lower metal layer 13B, may coincide with those of the magnetoresistive element 19. In addition, the side surfaces of the other lower metal layer 13B, which are on the lower metal layer 13B side, may coincide with those of the magnetoresistive element 19. In this case, the pitch B can be made smaller than the structure shown in FIG. 26.

Figure 34:
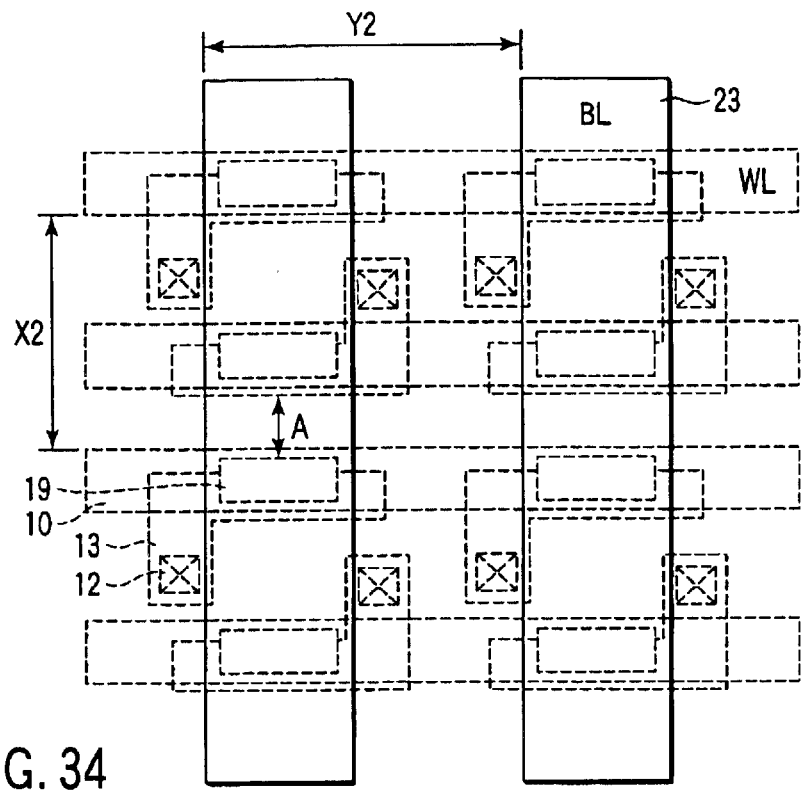

Alternatively, the magnetoresistive element 19 may be arranged such that its axis of hard magnetization matches the direction in which the bit line 23 runs, on the basis of the structure shown in FIG. 33, as shown in FIG. 34. In this case, the pitch A can be reduced in the direction in which the bit line 23 runs.

[Third Embodiment]

The third embodiment is a modification to the second embodiment. In the second embodiment, the side surfaces of a lower metal layer coincide with three side surfaces of a magnetoresistive element. In the third embodiment, the side surfaces of a lower metal layer coincides with four side surfaces of a magnetoresistive element.

Figure 37:
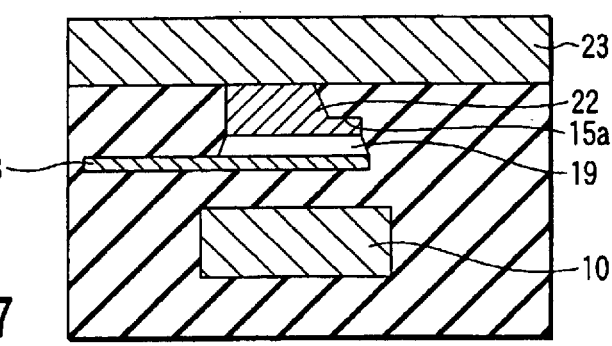
FIG. 37 is a sectional view showing the magnetic memory device taken along a line XXXVII—XXXVII in FIG. 35.
Figure 38:
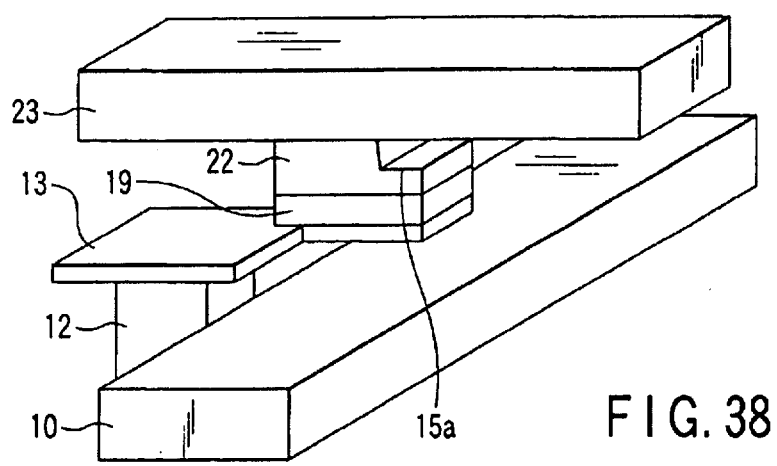
FIG. 38 is a perspective view showing the magnetic memory device according to the third embodiment of the present invention.
Figure 35:
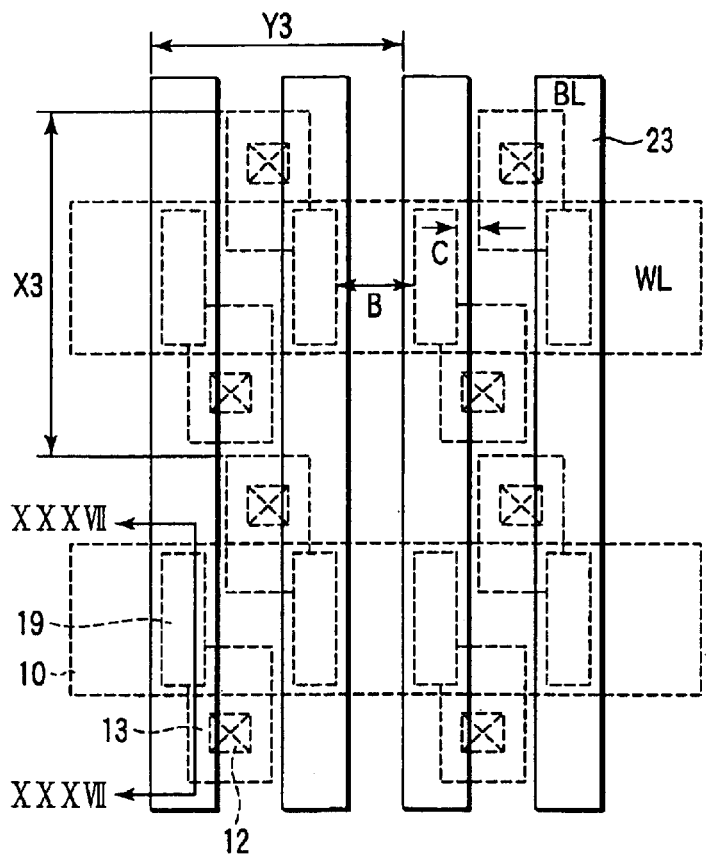
FIG. 35 is a plan view showing a magnetic memory device according to the third embodiment of the present invention.
Figure 36:
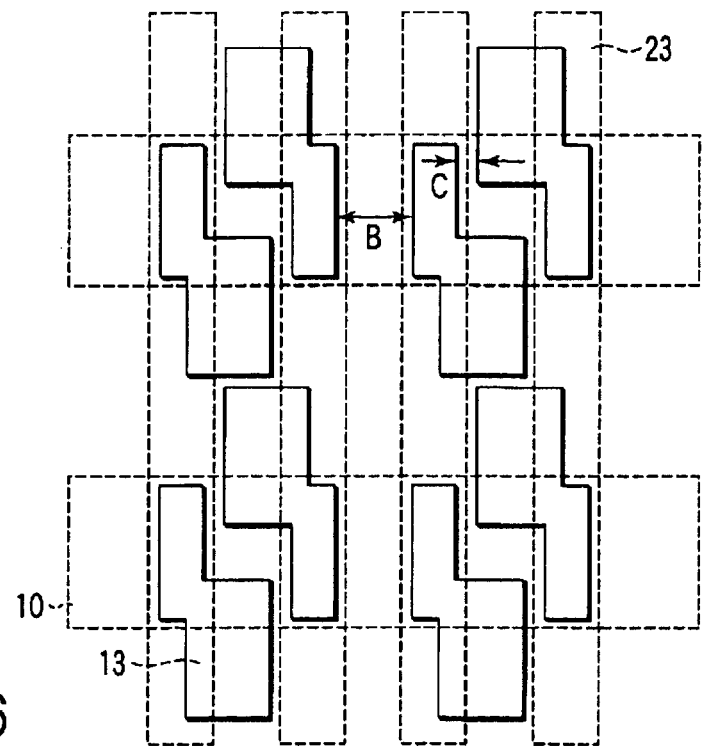
FIG. 36 is a plan view showing a lower metal layer according to the third embodiment of the present invention.

FIG. 35 is a plan view of a magnetic memory device according to the third embodiment of the present invention. FIG. 36 is a plan view of a lower metal layer according to the third embodiment of the present invention. Write lines are illustrated for reference. FIG. 37 is a sectional view of the magnetic memory device taken along a line XXXVII—XXXVII in FIG. 35. FIG. 38 is a perspective view of the magnetic memory device according to the third embodiment of the present invention.

As shown in FIGS. 35 to 38, the magnetic memory device according to the third embodiment is different from the second embodiment in that a side surface of a lower metal layer 13 coincides with four side surfaces of a magnetoresistive element 19. Two side surfaces of the magnetoresistive element 19 entirely coincide with the side surfaces of the lower metal layer 13. The two remaining side surfaces of the magnetoresistive element 19 partially coincide with the side surfaces of the lower metal layer 13. As in the first and second embodiments, the side surfaces of the first contact 12 partially coincide with those of the magnetoresistive element 19. Hence, the lower metal layer 13 partially has the same shape as that of the magnetoresistive element 19.

Figure 39:
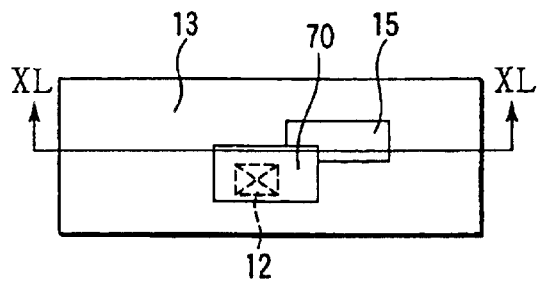
FIG. 39 is a plan view showing a step in manufacturing the magnetic memory device according to the third embodiment of the present invention.
Figure 40:
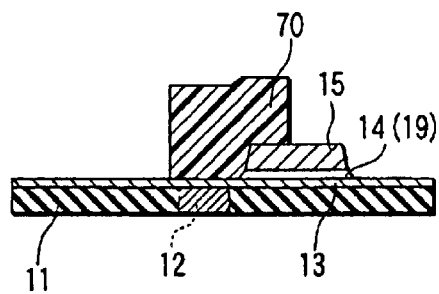
FIG. 40 is a sectional view of the magnetic memory device taken along a line XL—XL in FIG. 39.

For the magnetic memory device according to the third embodiment, the lower metal layer 13 is patterned using a resist 70 shown in FIGS. 39 and 40. The remaining processes are the same as in the first embodiment.

According to the third embodiment, the lower metal layer 13 is formed without preparing any margin around the magnetoresistive element 19. The side surfaces of the lower metal layer 13 partially coincide with those of the magnetoresistive element 19. For this reason, if minimum pitches B and C are maintained between the adjacent lower metal layers 13 in the direction in which a word line 10 runs, a pitch Y3 between the bit lines 23 can be made smaller than the conventional pitch Y" (FIG. 35). As described above, according to the third embodiment, since the area of the lower metal layer 13 can be reduced in the direction in which the word line 10 runs, the cell area can be reduced.

As in the first embodiment, over-etching can be reduced, and the process can be simplified.

Figure 41:
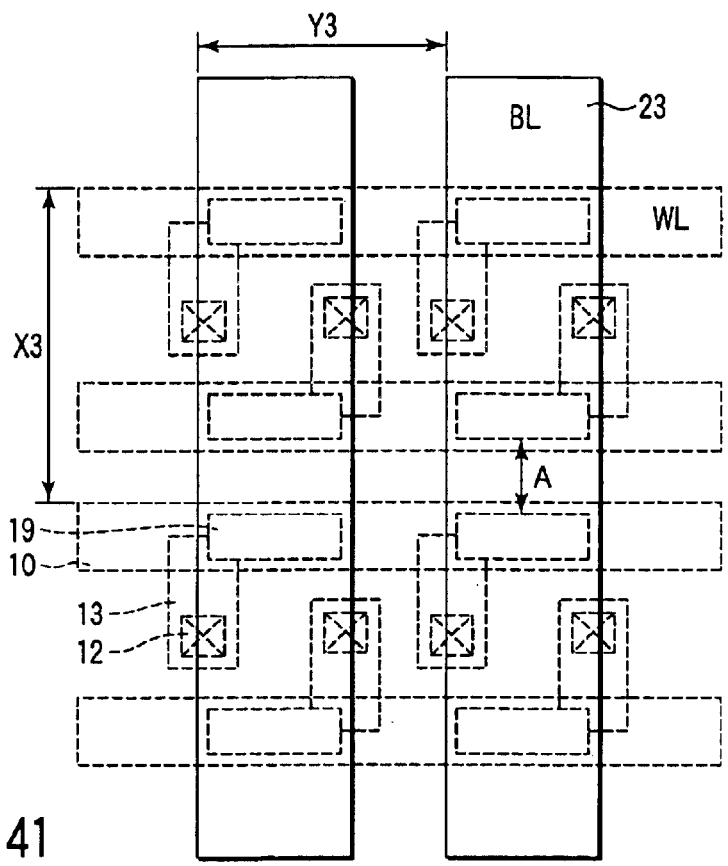
FIGS. 41 to 43 are plan views showing another magnetic memory device according to the third embodiment of the present invention.

In the third embodiment, the magnetoresistive element 19 may be arranged such that its axis of hard magnetization matches the direction in which the bit line 23 runs, as shown in FIG. 41. In this case, a pitch A can be reduced in the direction in which the bit line 23 runs.

Figure 42:
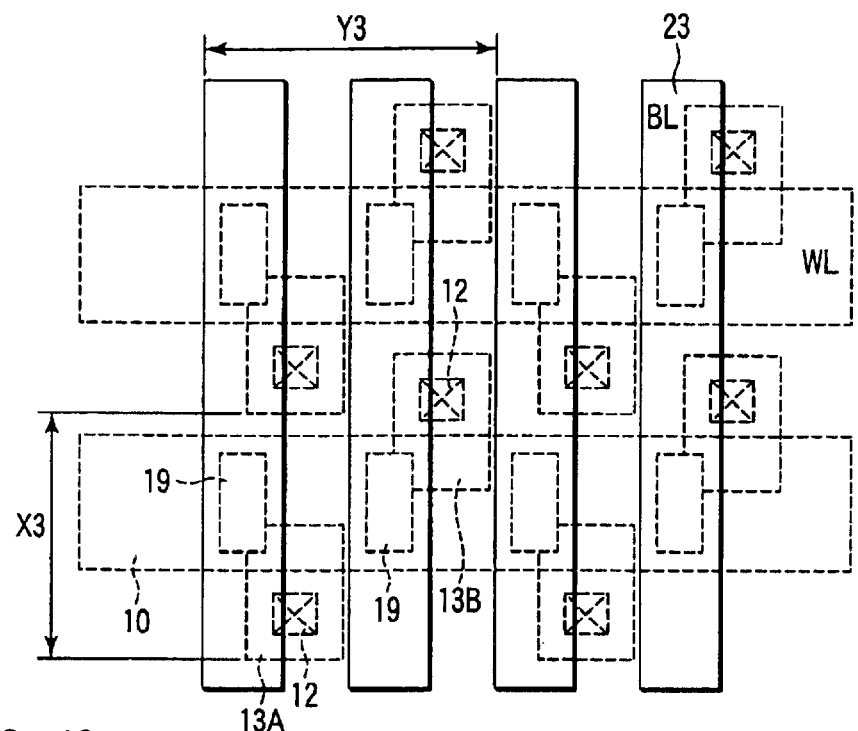

Lower metal layers 13A and 13B adjacent to each other in the direction in which the word line 10 runs are regarded as a pair, as shown in FIG. 42. A contact 12 in one lower metal layer 13A may be arranged close to the other lower metal layer 13B. The contact 12 in the other lower metal layer 13B may be separated from one lower metal layer 13A. In this case, the pitch B can be made smaller than the structure shown in FIG. 35.

Figure 43:
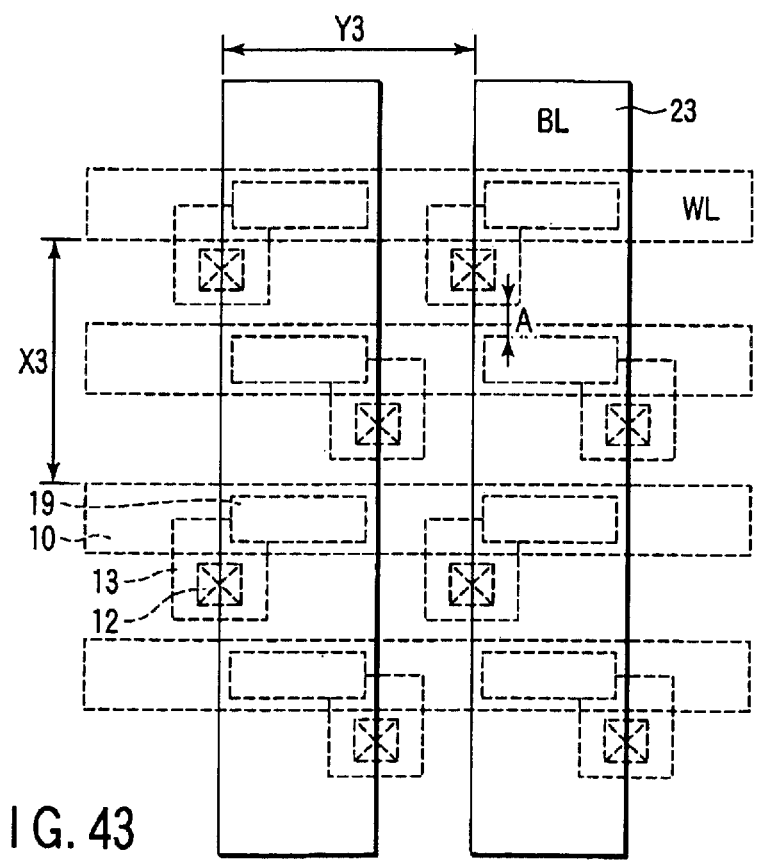

Alternatively, the magnetoresistive element 19 may be arranged such that its axis of hard magnetization matches the direction in which the bit line 23 runs, on the basis of the structure shown in FIG. 42, as shown in FIG. 43. In this case, the pitch A can be reduced in the direction in which the bit line 23 runs.

[Fourth Embodiment]

The structure of the fourth embodiment is the same as that of the third embodiment, though the manufacturing method is different from that of the third embodiment.

FIGS. 44 to 49 are views showing steps in manufacturing a magnetic memory device according to the fourth embodiment of the present invention. A method of manufacturing the magnetic memory device according to the fourth embodiment will be described below. A description of the same steps as in the first embodiment will be omitted or simplified.

First, as shown in FIGS. 5 to 14, a magnetoresistive element 19 is formed, as in the first embodiment.

Figure 44:
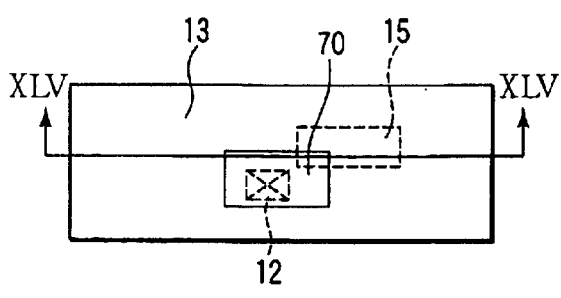
FIG. 44 is a plan view showing a step in manufacturing a magnetic memory device according to the fourth embodiment of the present invention.
Figure 45:
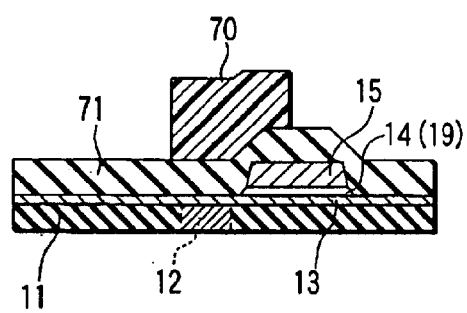
FIG. 45 is a sectional view of the magnetic memory device taken along a line XLV—XLV in FIG. 44.

Next, as shown in FIGS. 44 and 45, a third hard mask 71 having insulating properties is formed to cover the magnetoresistive element 19. A photoresist 70 is formed on the third hard mask 71. Then, the photoresist 70 is patterned into the shape of a lower metal layer 13.

Figure 46:
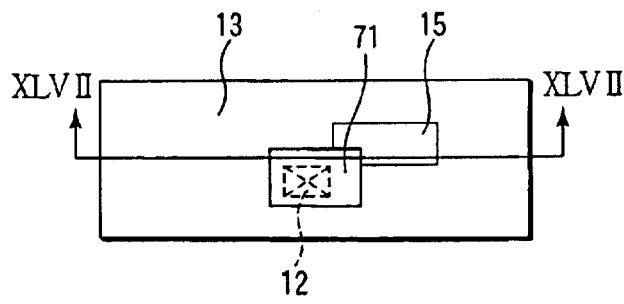
FIG. 46 is a plan view showing a step in manufacturing the magnetic memory device according to the fourth embodiment of the present invention next to FIG. 44.
Figure 47:
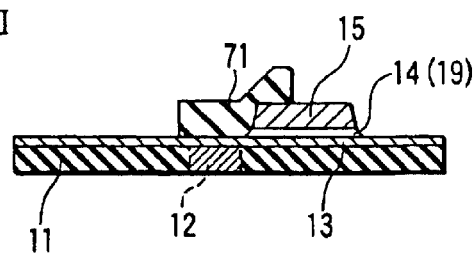
FIG. 47 is a sectional view of the magnetic memory device taken along a line XLVII—XLVII in FIG. 46.

As shown in FIGS. 46 and 47, the third hard mask 71 is patterned by using the photoresist 70 as a mask to transfer the shape of the lower metal layer 13 to the third hard mask 71.

Figure 48:
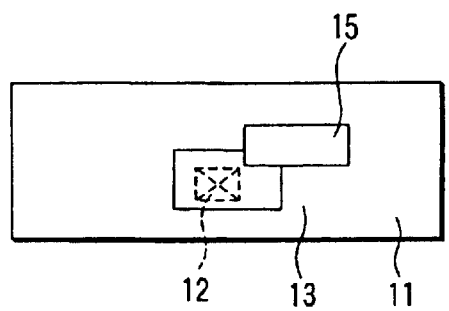
FIG. 48 is a plan view showing a step in manufacturing the magnetic memory device according to the fourth embodiment of the present invention next to FIG. 46.
Figure 49:
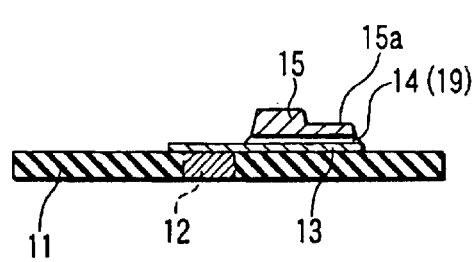
FIG. 49 is a sectional view of the magnetic memory device taken along a line XLIX—XLIX in FIG. 48.

As shown in FIGS. 48 and 49, the lower metal layer 13 is etched by using the third hard mask 71 as a mask. At this time, the exposed portion of a first hard mask 15 is also partially removed so that a step portion 15a is formed. Subsequent steps are the same as in the first embodiment, and a description thereof will be omitted.

According to the fourth embodiment, the same effects as in the third embodiment can be obtained.

Additionally, in the fourth embodiment, when the lower metal layer 13 is to be processed, the shape of the lower metal layer 13 is temporarily transferred to the third hard mask 71. Then, the lower metal layer 13 is processed using the third hard mask 71. Since the resist 70 does not come into direct contact with a magnetoresistive film 14, corrosion of the magnetoresistive film 14 by a strong acid in the resist 70 can be prevented.

[Fifth Embodiment]

In the fifth embodiment, an insulating protective film is formed on the side surfaces of a magnetoresistive element in each of the above embodiments.

FIGS. 50 to 53 are sectional views showing steps in manufacturing a magnetic memory device according to the fifth embodiment of the present invention. An example in which the fifth embodiment is applied to the first embodiment will be described here.

First, as in the first embodiment, a first hard mask 15 is patterned using a second hard mask 16, as shown in FIGS.

5 to 10. The first hard mask 15 is formed from a conductive film. The second hard mask 16 is formed from an insulating film made of, e.g., SiOx.

Figure 50:
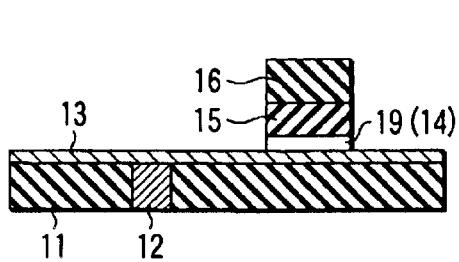
FIG. 50 is a sectional view showing a step in manufacturing a magnetic memory device according to the fifth embodiment of the present invention.

Next, as shown in FIG. 50, a magnetoresistive film 14 is patterned using the first and second hard masks 15 and 16 to form a magnetoresistive element 19.

Figure 51:
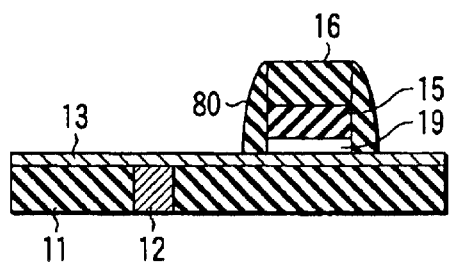
FIG. 51 is a sectional view showing a step in manufacturing the magnetic memory device according to the fifth embodiment of the present invention next to FIG. 50.

As shown in FIG. 51, an insulating protective film 80 is formed on the side surfaces of the first and second hard masks 15 and 16 and magnetoresistive element 19. Examples of the material of the insulating protective film 80 are silicon oxide, silicon nitride, and alumina.

Figure 52:
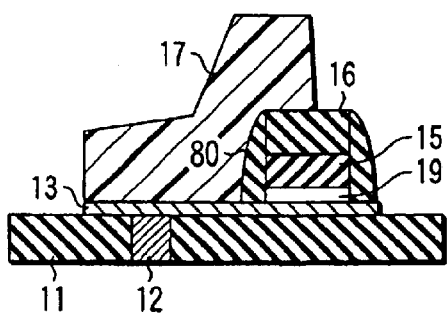
FIG. 52 is a sectional view showing a step in manufacturing the magnetic memory device according to the fifth embodiment of the present invention next to FIG. 51.

As shown in FIG. 52, a photoresist 70 is applied onto a lower metal layer 13 and the second hard mask 16 and insulating protective film 80. The photoresist 70 is patterned into the desired shape of the lower metal layer 13. Next, the lower metal layer 13 is etched using the photoresist 70. Then, the photoresist 70 is removed.

Figure 53:
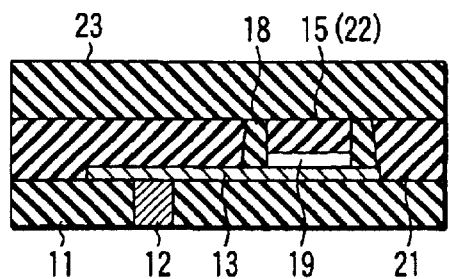
FIG. 53 is a sectional view showing a step in manufacturing the magnetic memory device according to the fifth embodiment of the present invention next to FIG. 52.

As shown in FIG. 53, a second insulating film 21 is formed on a first insulating film 11 and the lower metal layer 13, second hard mask 16, and insulating protective film 80. The surface of the second insulating film 21 is planarized by using CMP or RIE until reaching the first hard mask 15. With this process, the surface of a second contact 22 formed from the first hard mask 15 is exposed so that a contact is formed in a self-aligned manner. Next, a bit line 23 is formed on the second contact 22, second insulating film 21, and insulating protective film 80.

According to the fifth embodiment, the insulating protective film 80 is formed on the side surfaces of the magnetoresistive element 19. Hence, when the lower metal layer 13 is processed, the conductive deposition of the lower metal layer 13 can be prevented from sticking to the side surfaces of the magnetoresistive element 19. If the conductive deposition of the lower metal layer 13 sticks to the junction portion of the magnetoresistive element 19, a short circuit may occur. Since this problem can be prevented, a highly reliable junction can be implemented.

[Sixth Embodiment]

In the sixth embodiment, a structure including no switching element is applied to each of the above embodiments.

Figure 54:
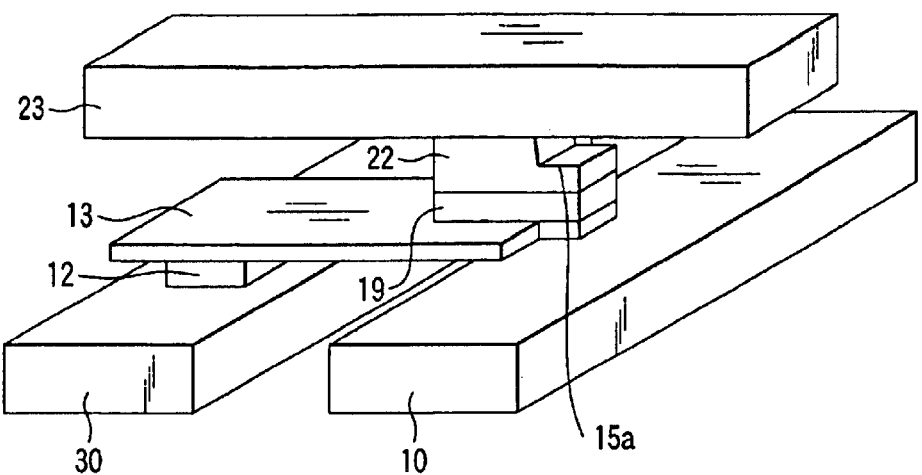
FIGS. 54 and 55 are perspective views showing a magnetic memory device according to the sixth embodiment of the present invention.
Figure 55:
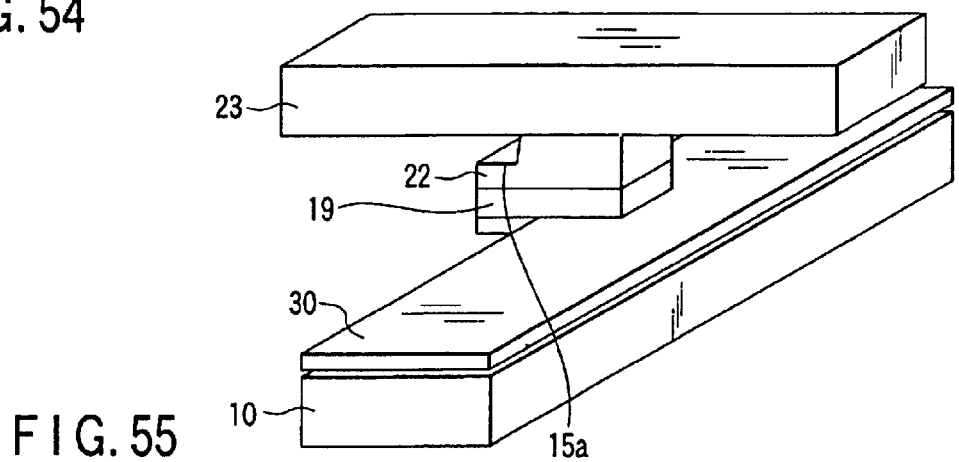

FIGS. 54 and 55 are perspective views of magnetic memory devices according to the sixth embodiment of the present invention. As shown in FIGS. 54 and 55, a word line is separated into a write line and read line. In a write mode, a bit line 23 and write word line 10 are used. In a read mode, the bit line 23 and a read word line 30 are used.

In the structure shown in FIG. 54, a lower metal layer 13 is connected to the read word line 30 through a contact 12. The read word line 30 is arranged on the same plane as that of the write word line 10 and runs parallel to the write word line 10.

In the structure shown in FIG. 55, the read word line 30 is directly connected to a magnetoresistive element 19. The read word line 30 runs parallel to the write word line 10. The side surfaces of the read word line 30 partially coincide with those of the magnetoresistive element 19.

Referring to FIGS. 54 and 55, the axis of easy magnetization of the magnetoresistive element 19 is parallel to the direction in which the bit line 23 runs. However, the axis of hard magnetization of the magnetoresistive element 19 may be set parallel to the direction in which the bit line 23 runs.

Figure 56:
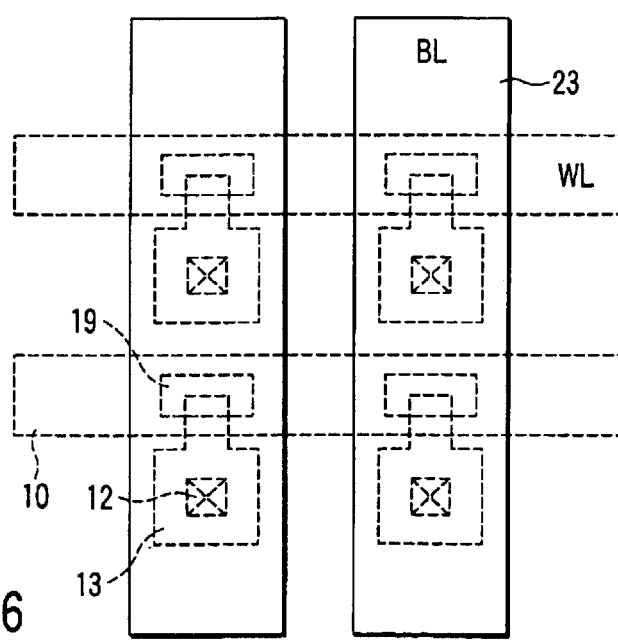
FIG. 56 is a perspective view showing another magnetic memory device according to each embodiment of the present invention.

The present invention is not limited to the above embodiments, and various changes and modifications can be made in practice without departing from the spirit and scope of the invention. For example, as shown in FIG. 56, the lower metal layer 13 can be made smaller than the magnetoresistive element 19 at the connection portion between the lower metal layer 13 and the magnetoresistive element 19. In this case, the entire projecting region of the lower metal layer 13 can be eliminated at the end portion along the axis of easy magnetization of the magnetoresistive element 19. Hence, the magnetic characteristic shift due to magnetic field leakage described in the first embodiment can particularly be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:

a first interconnection which runs in a first direction;

a second interconnection which runs in a second direction different from the first direction;

a magnetoresistive element which is arranged at an intersection of and between the first and second interconnections; and a metal layer which is connected to the magnetoresistive element and has a side surface that partially coincides with a side surface of the magnetoresistive element.

2. The device according to claim 1, wherein the device further comprises a contact layer which is connected to the metal layer and covered with the metal layer, the magnetoresistive element has a first side surface that is located on a side of the contact layer and a second side surface that is located on an opposite side of the first side surface, and the second side surface coincides with the side surface of the metal layer.

3. The device according to claim 2, wherein the contact layer is arranged below the second interconnection.

4. The device according to claim 1, further comprising a contact layer which is arranged between the magnetoresistive element and the second interconnection and connected to the magnetoresistive element and the second interconnection.

5. The device according to claim 4, wherein the contact layer has a step portion.

6. The device according to claim 4, wherein a planar shape of the contact layer is substantially the same as a planar shape of the magnetoresistive element.

7. The device according to claim 1, wherein the magnetoresistive element has an axis of easy magnetization and an axis of hard magnetization, the first interconnection is a word line, and the second interconnection is a bit line, and the magnetoresistive element is arranged that the axis of easy magnetization matches the second direction.

8. The device according to claim 1, wherein the magnetoresistive element has an axis of easy magnetization and an axis of hard magnetization, the first interconnection is a word line, and the second interconnection is a bit line, and the magnetoresistive element is arranged that the axis of hard magnetization matches the second direction.

9. The device according to claim 1, wherein the metal layer is formed across the first interconnection, and the side surface of the metal layer above the first interconnection coincides with the side surface of the magnetoresistive element.

10. The device according to claim 1, wherein the magnetoresistive element has first to fourth side surfaces, and the first and second side surfaces entirely coincide with the side surfaces of the metal layer, and the third and fourth side surfaces partially coincide with the side surfaces of the metal layer.

11. The device according to claim 1, further comprising a third interconnection which is connected to the metal layer, runs parallel to the first interconnection on the same plane as that of the first interconnection, and is used as a read line.

12. The device according to claim 1, wherein the metal layer runs parallel to the first interconnection and is used as a read line.

13. The device according to claim 1, wherein the magnetoresistive element has an axis of easy magnetization and an axis of hard magnetization, and the side surfaces of the magnetoresistive element at two end portions along the axis of easy magnetization coincide with the side surfaces of the metal layer.

14. A method of manufacturing a magnetic memory device, comprising:

sequentially forming a metal layer, a magnetoresistive film, and first and second mask layers on a first insulating film;

patterning the second mask layer into an element shape of a magnetoresistive element;

patterning the first mask layer into the element shape by using the patterned second mask layer;

patterning the magnetoresistive film into the element shape by using the patterned first mask layer to form the magnetoresistive element; and patterning the metal layer into a separation shape that separates cells and making a side surface of the metal layer partially coincide with a side surface of the magnetoresistive element.

15. The method according to claim 14, wherein the method further comprises, after formation of the magnetoresistive element, forming a resist on the first mask layer and the metal layer, and patterning the resist into the separation shape, and the metal layer is patterned by using the patterned resist.

16. The method according to claim 14, wherein in patterning the metal layer, the first mask layer is partially removed to form a step portion in the first mask layer.

17. The method according to claim 14, further comprising, after patterning of the metal layer, forming a second insulating film on the first insulating film, the magnetoresistive element, and the metal layer, and removing the second insulating film until a surface of the first mask layer is exposed to form a contact formed from the first mask layer in a self-aligned manner.

18. The method according to claim 17, wherein the second insulating film is removed by CMP.

19. The method according to claim 14, wherein the first mask layer is formed from a conductive layer.

20. The method according to claim 14, wherein the second mask layer is formed from an insulating layer.

21. The method according to claim 14, wherein the method further comprising, after formation of the magnetoresistive element, forming a third mask layer on the first mask layer and the metal layer, forming a resist on the third mask layer, patterning the resist into the separation shape, and patterning the third mask layer into the separation shape by using the patterned resist, and the metal layer is patterned by using the patterned third mask layer.

22. The method according to claim 21, wherein the third mask layer is formed from an insulating layer.

23. The method according to claim 14, further comprising, before patterning the metal layer into the separation shape, forming an insulating protective film on the side surfaces of the magnetoresistive element.

* * * * *